United States Patent [19]
Young

[11] Patent Number: 6,157,671
[45] Date of Patent: Dec. 5, 2000

[54] APPARATUS AND METHOD FOR DIGITALLY MONITORING A DUTY CYCLE OF A PULSE WIDTH MODULATED SIGNAL

[75] Inventor: Paul M. Young, Peoria, Ill.

[73] Assignee: Caterpillar Inc., Peoria, Ill.

[21] Appl. No.: 08/964,384

[22] Filed: Nov. 6, 1997

[51] Int. Cl.[7] .............................. H03K 7/08; H03K 9/08
[52] U.S. Cl. ........................ 375/238; 332/109; 329/312
[58] Field of Search .................................. 375/238, 259, 375/340; 329/312; 332/109; 340/825.63, 825.65; 341/153; 348/539

[56] References Cited

U.S. PATENT DOCUMENTS

| | | | |
|---|---|---|---|
| 4,724,421 | 2/1988 | Simison et al. | 341/53 |
| 5,901,176 | 5/1999 | Lewison | 375/238 |
| 5,905,406 | 5/1999 | Sugden et al. | 329/312 |
| 6,014,176 | 1/2000 | Nayebi et al. | 348/539 |

*Primary Examiner*—Stephen Chin
*Assistant Examiner*—Chieh M. Fan
*Attorney, Agent, or Firm*—Haverstock, Garrett & Roberts

[57] ABSTRACT

A circuit for digitally monitoring a duty cycle of a pulse width modulated signal is provided. The circuit includes a counter portion, a digital filter, and a data storage device. The counter portion is connectable to receive the pulse width modulated signal and is operable to monitor the pulse width modulated signal for a predetermined time period during which a count value is established. The digital filter is connected to receive the count value established by the counter portion and is also connected to receive a stored count value from the storage device, the digital filter being operable to establish a filtered count value based upon the count value and the stored count value input thereto. The storage device is connected to receive the filtered count value established by the digital filter. Multiple pwm signals may be also be monitored by including multiple counters, multiple storage devices, and one or more multiplexers.

19 Claims, 3 Drawing Sheets

APPARATUS AND METHOD FOR DIGITALLY MONITORING A DUTY CYCLE OF A PULSE WIDTH MODULATED SIGNAL

TECHNICAL FIELD

This invention relates generally to monitoring the duty cycle of pulse width modulated (pwm) signals and more particularly, to a circuit and method for digitally monitoring the duty cycle of one or more pwm signals.

BACKGROUND ART

Control systems such as electronic engine controllers receive signals from a variety of sources for the purpose of monitoring various engine parameters. In particular, certain types of engine sensors such as certain temperature sensors and pressure sensors are operable to provide a pulse width modulated signal to the engine controller having a duty cycle which is proportional to the parameter being sensed. In such cases it is desirable to determine the duty cycle of the received pwm signal for purposes of monitoring the given parameter. In the past such pwm signals have been passed through analog filters capable of establishing a dc voltage level proportional to the duty cycle of the pwm signal. An analog to digital converter was then utilized to convert the dc voltage level to a digital value which could be read and interpreted by processing means such as a microprocessor.

One problem with such systems was the inherent error associated with analog filters, such as error associated with component variations. Further, although the engine sensors utilized are intended to output a pwm signal having a certain frequency, often times there is a certain amount of frequency drift associated with the pwm output signals of such sensors. For example, a sensor intended to output a pwm signal of 5 kHz may output a pwm signal having a frequency in the range of 3 to 12 kHz. The dc voltage level established by an analog filter could therefore vary depending upon the frequency of the pwm signal and the cutoff frequency of the analog filter. Further, the dc voltage level established could include some jitter in lower frequency pwm signals. In systems including long cables running from the sensors to the duty cycle measuring point, there can be capacitance associated with such cables which is sufficient to cause duty cycle error, and it is therefore desirable to reduce the capacitance in such systems. The capacitance can be reduced by eliminating analog filters. Still further, such prior art systems have required a significant amount of PC board space, particularly when multiple pwm signals were involved.

Accordingly, the present invention is directed to overcoming one or more of the problems as set forth above.

DISCLOSURE OF THE INVENTION

In one embodiment of the present invention a circuit for digitally monitoring a duty cycle of a pulse width modulated signal is provided. The circuit includes a counter portion, a digital filter, and a data storage device. The counter portion is connectable to receive the pulse width modulated signal and is operable to monitor the pulse width modulated signal for a predetermined time period during which a count value is established, the established count value corresponding to the portion of the predetermined time period during which the pwm signal is in a predetermined state, that is, either high or low. The digital filter is connected to receive the count value established by the counter portion and is also connected to receive a stored count value from the storage device, the digital filter being operable to establish a filtered count value based upon the count value and the stored count value input thereto. The storage device is connected to receive the filtered count value established by the digital filter.

In systems where it is desirable to monitor multiple pwm signals, a plurality of counters and storage devices, such as latches, are provided, one counter and one latch corresponding to each monitored pwm signal. The output of each counter is provided as an input to a first multiplexer which has an output connected to the digital filter. An output of each latch is provided as an input to a second multiplexer which also has an output connected to the digital filter. A sampling counter is connected to selecting inputs of each multiplexer to control the count value and the stored or latched count value passed to the digital filter. This circuit advantageously allows for multiple pwm signals to be monitored without requiring a separate digital filter for each monitored signal.

BRIEF DESCRIPTION OF DRAWINGS

For a better understanding of the present invention, reference may be made to the accompanying drawings in which.

BEST MODE FOR CARRYING OUT THE INVENTION

Figure 1:
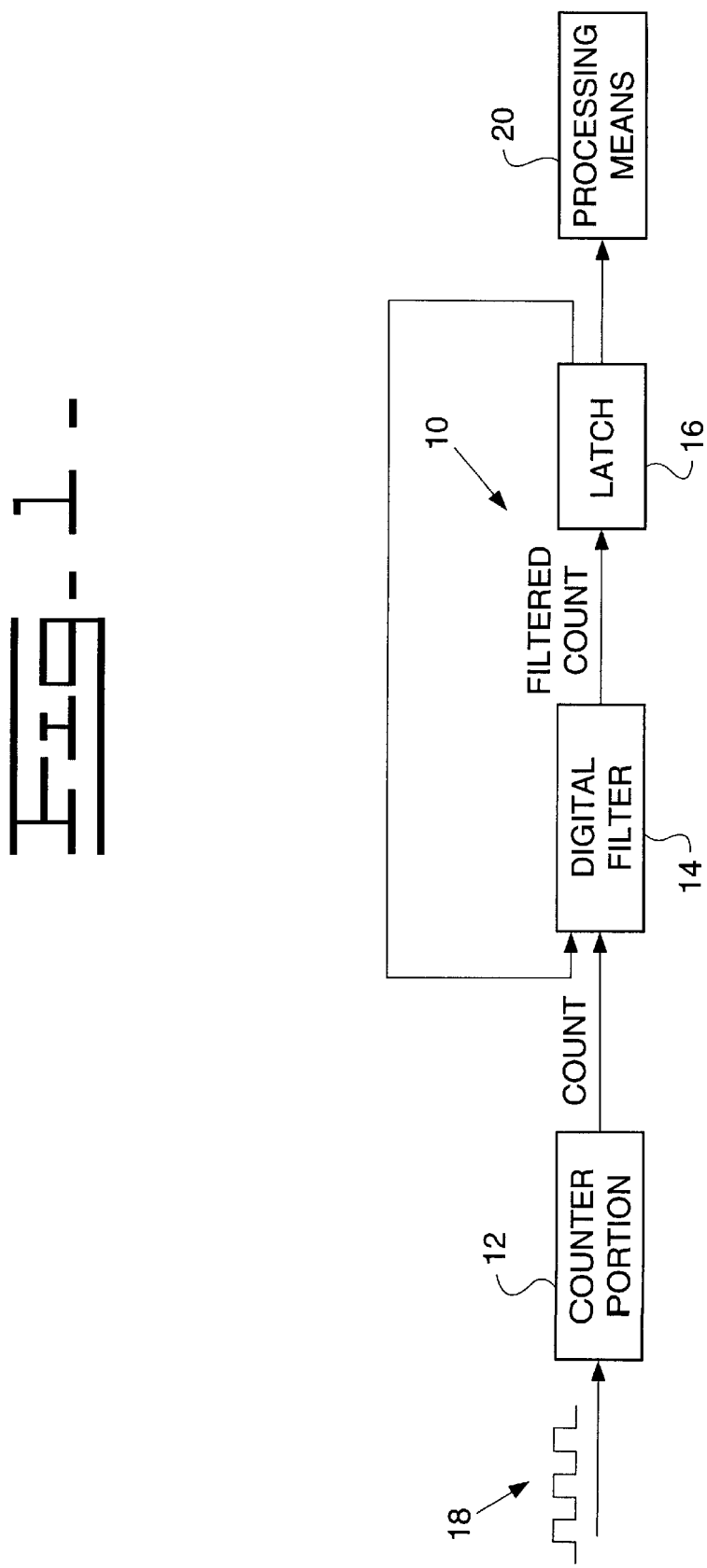
FIG. 1 is a block diagram of a circuit according to the present invention.

Referring now to the drawings, FIG. 1 represents a block diagram of a circuit 10 according to the present invention, including a counter portion 12, a digital filter 14, and latch 16 or other type register or data storage device. A pwm signal 18, which may typically vary in duty cycle and which may also vary in frequency, is provided as an input to the counter portion 12 which is operable to monitor pwm signal 18 for a predetermined time period during which a count value representative of the high or low time of pwm signal 18 during the predetermined time period is established. Counter portion 12 might include, for example, a ten bit up counter which is capable of counting from 0 to 1023 during the predetermined time period. The counter may be configured to count only when the input pwm signal 18 is high so that the count established will approximate the duty cycle of the pwm signal. For example, if the duty cycle of pwm signal 18 is fifty percent, the established count will average about 511 or 512. Similarly, if the duty cycle of pwm signal 18 is twenty percent, the established count will average about 204 or 205. Digital filter 14 is connected to receive the count value established by counter portion 12 at fixed intervals, such as at the end of each predetermined time period. The digital filter is operable to establish a filtered count value which compensates for noise which might be coupled with pwm signal 18. As explained in further detail below, digital filter 14 is also capable of overcoming variations in established counts which variations may be caused by the predetermined time period not being an integer multiple of the pwm signal period. Latch 16 is connected to receive the filtered count value established by digital filter 14 and to store the filtered count value such that it is accessible by processing means 20. The processing means 20 includes programming to correlate the accessed, latched or otherwise stored count value with the duty cycle of the pwm signal 18.

Figure 2:
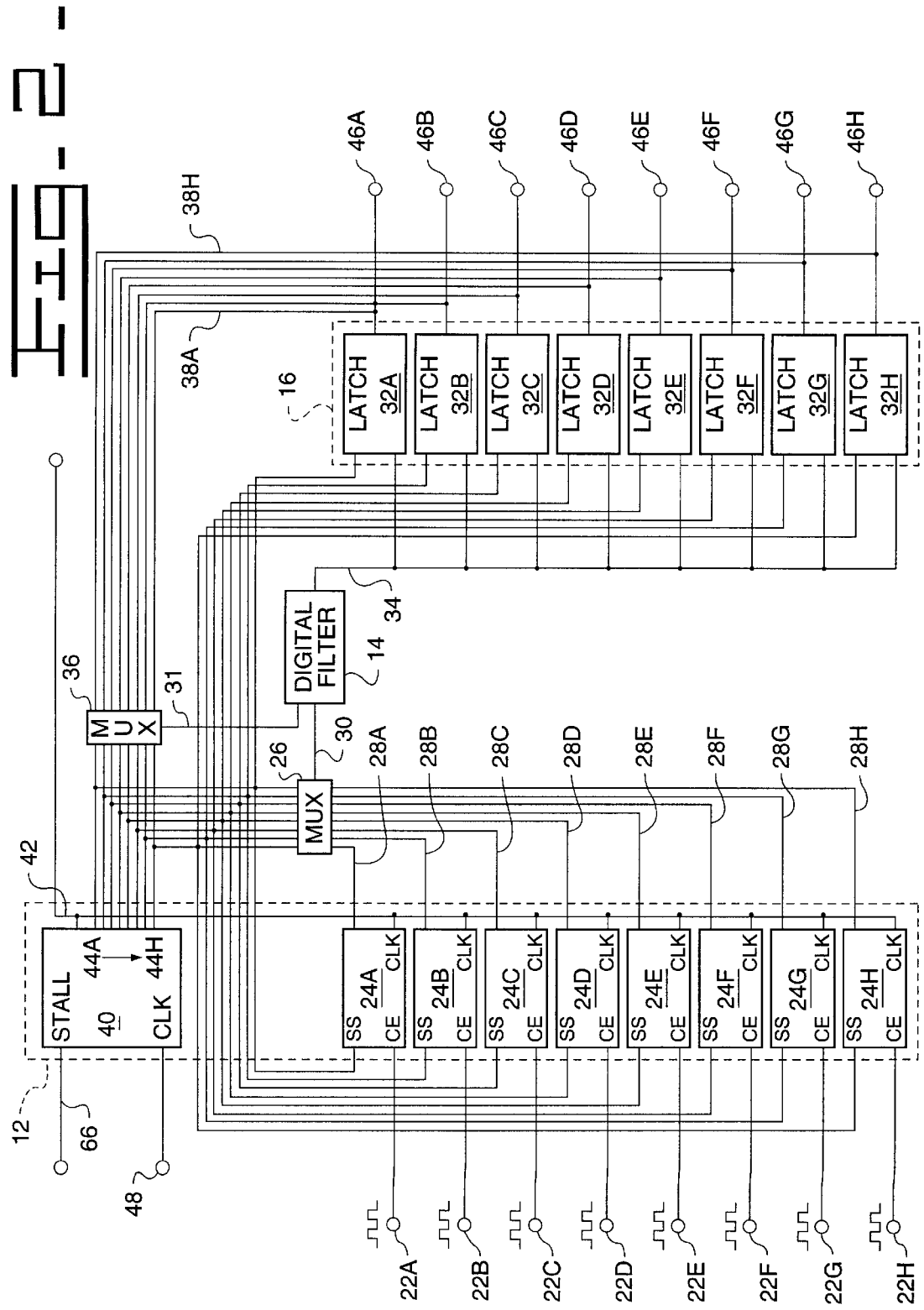
FIG. 2 is a block diagram of a preferred embodiment of the circuit of FIG. 1.

As depicted in the preferred embodiment of circuit 10 shown in FIG. 2, multiple pwm signals 22A–22H can be monitored, each pwm signal being applied as an input to a corresponding counter 24A–24H. Each counter 24A–24H may be configured to count only when the respective input pwm signal 22A–22H is in a predetermined state, that is, only when such signal is either high or low. For example, each pwm signal may be connected to a clock enable (CE) input of its respective counter 24A–24H, the counters counting only when the clock enable input is high, and thus only when the pwm input signal thereto is high. In this manner the average count value established by each counter 24A–24H will depend upon and be approximately proportional to the duty cycle of the respective pwm signal 22A–22H input thereto.

The digital count established by each counter is applied as an input to a multiplexer 26 via appropriate bus connections 28A–28H. An output of multiplexer 26 is connected as an input to digital filter 14 via bus connection 30. The output of digital filter 14 is connected to each of a plurality of latches 32A–32H via bus connection 34. The latched-in count value of each of latches 32A–32H is applied as an input to multiplexer 36 via appropriate bus connections 38A–38H, an output of multiplexer 36 being connected as an input to digital filter 14 via bus connection 31.

A sampling counter 40 includes a count output 42 connected as a clock input (CLK) to each counter 24A–24H. Sampling counter 40 also includes a plurality of outputs 44A–44H connected to respective selecting inputs of multiplexer 26, to respective selecting inputs of multiplexer 36, and also connected as reset or start/stop (SS) inputs of respective counters 24A–24H. Accordingly, sampling counter 40 controls which counter count value is passed through multiplexer 26 to digital filter 14 and also controls which latched count value is passed through multiplexer 36 to digital filter 14. The sampling rate or strobe rate of outputs 44A–44H is generally set by the predetermined time period during which counters 24A–24H establish their respective counts. Sampling counter outputs 44A–44H are also connected to corresponding latches 32A–32H for controlling updating of the values latched therein.

Industrial Applicability

Circuits in accordance with the present invention enable one or more pwm signal duty cycles to be monitored digitally, without requiring use of analog components. In particular, the digital count of a given counter corresponds to the duty cycle of the pwm signal input thereto because counting within the given counter will only take place when the pwm input signal is in a predetermined state, that is when the pwm signal is either high or low. The stored or latched count values in latches 32A–32H can therefore be accessed by appropriate processing means (not shown) via bus connections 46A–46H, the processing means including appropriate programming for correlating latched or otherwise stored count values to particular duty cycles.

By way of example, the circuit of FIG. 2 can be utilized to monitor the duty cycles of 8 pwm input signals having similar frequencies or different frequencies. In this regard, the count bit of count output 42 utilized as the clock input to a given counter may be selected to achieve a desired clock frequency for the counter based upon the expected frequency of the pwm input signal thereto, the count achievable by the counter, and the system clock frequency, which system clock is provided as an input 48 to sampling counter 40. Assuming a system clock frequency of 16 MHz applied at the clock input of sampling counter 40, bit 0 of count output 42 will correspond to a clock frequency of 8 MHz; bit 1 will correspond to a clock frequency of 4 MHz; bit 2 will correspond to a clock frequency of 2 MHz; bit 3 will correspond to a clock frequency of 1 MHz; bit 4 will correspond to a clock frequency of 500 kHz; bit 5 will correspond to a clock frequency of 250 kHz; bit 6 will correspond to a clock frequency of 125 kHz; and so on.

Assuming a ten bit counter 24A capable of counting from 0 to 1023, it will be desirable to enable counter 24A to count for a predetermined time period during which counter 24A could potentially count all of the way from 0 to 1023, before being reset. Assuming a pwm signal 22A of about 5 kHz, such pwm signal will have a period of about 0.2 milliseconds. If it is desired that the predetermined time period for counting should cover about twenty periods of pwm signal 22A, then the predetermined time period should be about 4 milliseconds. To enable counter 24A to count from 0 to 1023 in about 4 milliseconds, the frequency of an appropriate clock input to counter 24A should be about 250 kHz. Therefore, bit 5 of count output 42 of sampling counter 40, corresponding to a clock frequency of 250 kHz, should be selected as a clock input to counter 24A. Accordingly, the predetermined time period between resetting of counter 24A should be about 4.096 milliseconds. Sampling counter 40 can therefore be selected as a 16 bit counter because, at a system clock frequency input of 16 MHz, a 16 bit counter will count from 0 to the maximum value of 65536 in 4.096 milliseconds.

Assuming the 4.096 millisecond counting time period determined above, sampling counter 40 should output a predetermined sampling signal on line 44A about every 4.096 milliseconds. The sampling signal will be directed to a selecting input of multiplexer 26 in order to pass the count value of counter 24A through multiplexer 26 to digital filter 14. The sampling signal will also be directed to a selecting input of multiplexer 36 causing it to pass through the latched count value of latch 32A to digital filter 14. Further, the sampling signal will be directed to counter 24A causing it to reset to zero so as to begin a new count. Still further, the sampling signal will be provided to corresponding latch 32A to control when the value stored therein is updated. Given that there are eight counters 24A–24H in the circuit of FIG. 2, every 0.512 milliseconds an appropriate predetermined sampling signal will be produced at one of the outputs 44A–44H in a sequential manner. In this way the same digital filter 14 can be utilized for each pwm signal 22A–22H being monitored.

With respect to digital filter 14, its purpose is to account for the fact that the predetermined time period for counting is not necessarily an integral multiple of the period of the monitored pwm signal. That is, during the predetermined time period for counting, each counter may count during a certain integer number of pwm signal periods as well as some fractional portion of the pwm signal period. In such cases the count established by a given counter will be weighted toward the fractional portion, either being too high if the pwm signal is high during the fractional portion or being too low if the pwm signal is low during the fractional portion. Digital filter 14 acts to average the count over a period of time.

Figure 3:
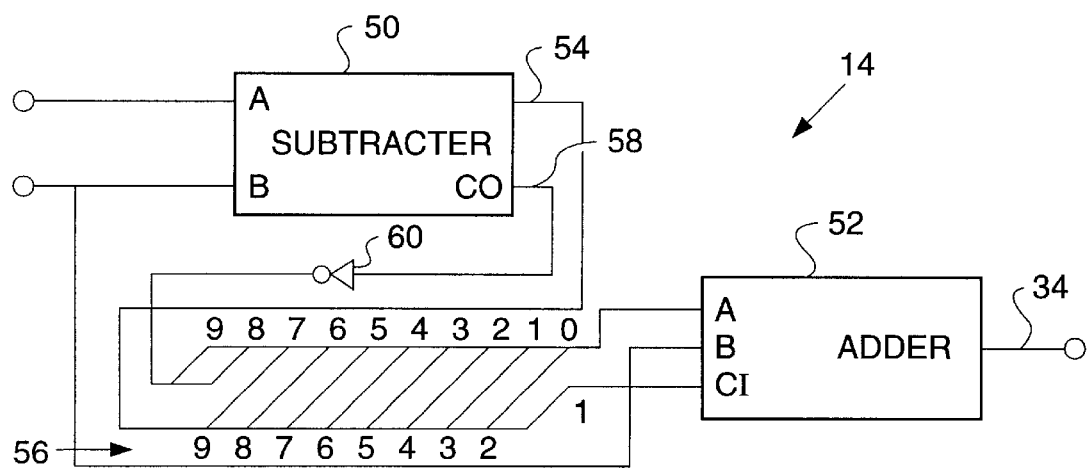
FIG. 3 is a block diagram of a digital filter utilized in the present invention.

In this regard, reference is made to FIG. 3 which illustrates a possible configuration for digital filter 14, including a subtracter 50 and an adder 52. At inputs A and B of the subtracter the count value of a given counter and the latched count value of a corresponding latch are applied, the count value being applied at A and the latched count value being applied at B. The latched count value at B represents the old, filtered count value from the previous counting period and the count value at A represents the count value of the counting period which just ended. The difference of the two input counts is provided at output 54 of subtracter 50 and then is essentially divided by four before being provided to input A of adder 52. Thus, adder 52 essentially adds ¼ of the difference output at 54 to the old, latched count value which is also provided as adder input B. In this manner, if the pwm input signal has a steady state duty cycle the filtered count value output by digital filter 14 will reach a steady state after about 0.08 seconds, assuming the example described above of a 5 kHz pwm signal. It is recognized that the circuit could be constructed to achieve steady state in some other time period.

The division of the difference output at 54 can be achieved relatively simply by arranging the bus lines as shown at 56 in order to achieve a two bit shift of the difference. For example, the output bus line for bit 2 of the difference is tied to input bus line 0 of adder input A, the output bus line for bit 3 of the difference is tied to input bus line 1 of adder input A, and so on as shown. output bus line 1 is applied as the adder carry in (CI) input bit. The carry over (CO) output bit 58 of subtracter 50 is passed through inverter 60 before being tied to input bus lines 8 and 9 of adder input A, in order to assure that the appropriate sign convention of the difference is maintained.

Digital filter 14 also advantageously reduces or filters out the effect of noise which may be coupled with a pwm signal. In particular, noise will typically be of a higher frequency, say 16 kHz or higher as opposed to the 5 kHz pwm signal assumed above, and such noise typically is high as often as it is low. Digital filter 14 essentially acts as a first order digital low pass filter by averaging out the effect of such noise.

Figure 4:
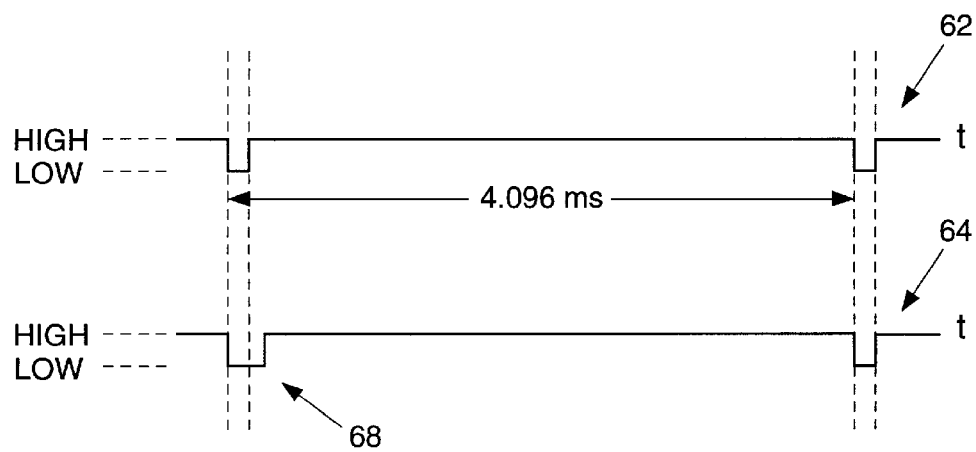
FIG. 4 is a representation of two sampling signals.

With regard to the sampling signals produced by sampling counter 40 at lines 44A–44H in order to achieve pass through of appropriate values from multiplexers 26 and 36, to reset the counters, and to control when new values are latched into the latches, reference is made to the signals depicted in FIG. 4. Signal 62 represents a signal output by sampling counter 40 at one of the outputs 44A–44H in order to achieve such functions. In this regard, it is seen that signal 62 is ordinarily high and that on a periodic basis, in this example every 4.096 milliseconds, signal 62 goes low for a couple system clock cycles. The proportion of low time to high time for signal 62 as illustrated is exaggerated for explanation purposes as compared to that which is necessary. Assuming signal 62 is being output at sampling counter output 44A, counter 24A (FIG. 2) can be configured such that when signal 62 goes low, counter 24A stops counting. Also, multiplexer 26 can be configured such that when signal 62 goes low the count value from counter 24A is passed to digital filter 14. Likewise, multiplexer 36 can be configured such that when signal 62 goes low the latched count value of latch 32A is passed to digital filter 14. It will only take one or two system clock cycles for the values to be processed through digital filter 14, which at a system clock speed such as 16 MHz will only be an insignificant portion of the 4.096 millisecond time period. Thus, one or two system clock cycles represents the minimum amount of time signal 62 needs to remain low in order to assure that the count value from counter 24A is held long enough to pass through digital filter 14. It is recognized that such low time of signal 62 could vary, although it is preferable to keep the low time as short as possible. Upon the transition of signal 62 from the low to high state, counter 24A is reset to zero and begins counting again. At the same time, latch 32A is triggered to update the value latched therein, replacing the old latched count value with the new filtered count value from digital filter 14. Similar sampling signals at sampling counter outputs 44B–44H, having the low-going portions thereof offset in time, will enable control of counters 24B–24H and corresponding latches 32B–32H.

Also shown in FIG. 4 is signal 64 which represents a slightly modified form of signal 62. Such modified signal 64 occurs when the latch count value of one or more latches is being accessed by a processing means. In such cases, it is desirable to assure that the latches are not in the process of updating the value latched therein. Accordingly, sampling counter 40 is provided with a stall input 66 (FIG. 2) which is connectable to the processing means to receive a signal indicative of a read operation by the processing means. When such stall signal is received, sampling counter 40 extends the low time of signal 64 as shown at 68 until the read operation is completed in order to assure that the latches do not attempt to update while a read is taking place. This configuration advantageously eliminates the need for double buffering of the counts.

As described above, the present invention provides an advantageous method of digitally monitoring the duty cycle of a pulse width modulated signal, including by performing a counting operation during a predetermined high or low state of the pulse width modulated signal to establish a count value, filtering the count value so as to establish a filtered count value, and storing the filtered count value.

Although the apparatus and method described herein has been explained by way of example with reference to a pwm input signal of about 5 kHz, it is recognized that the counters could be configured to receive a pwm input signal of another frequency by appropriate modification of which bit of sampling counter output count 42 is utilized as a clock input to the counters and appropriate timing of the sampling signals at outputs 44A–44H of the sampling counter 40. Similarly, in the circuit of FIG. 2 different counters could be configured to monitor different pwm signals having different frequencies in the same manner. Further, although counters 24A–24H have been described as counting when the pwm signal is high, it is recognized that such counters could be configured to count when the pwm signals input thereto are low. In such cases the processing means which reads the latched or otherwise stored values will require appropriate programming to correlate the resulting count to the duty cycle. Although counters 24A–24H have also been described as up counters, it is recognized that a circuit in accordance with the present invention could utilize down counters. Still further, although the circuit of FIG. 2 has been described as monitoring 8 pwm signals, it is recognized that the number of pwm signals monitored could vary according to the number of counters and corresponding latches utilized, and with appropriate configuration of multiplexers 26 and 36. It is further recognized that, although digital filter 14 has been described as a first order filter having a filter coefficient of one fourth, other digital filter configurations could be utilized, including digital filters having different filter coefficients as well as, for example, a second-order filter with the same or a different filter coefficient.

Other aspects, objects and advantages of the present invention can be obtained from a study of the drawings, the disclosure and the appended claims.

What is claimed is:

1. A circuit for digitally monitoring a duty cycle of a pulse width modulated signal, the circuit comprising:

a counter portion, a digital filter, and a storage device;

the counter portion connectable to receive the pulse width modulated signal and operable to monitor the received pulse width modulated signal for a predetermined time period during which a count value is established, the established count value corresponding to the portion of the predetermined time period during which the pwm signal is in a predetermined state;

the digital filter connected to receive the count value established by the counter portion and connected to receive a stored count value from the storage device, the digital filter operable to establish a filtered count value based upon the count value and the stored count value input thereto;

the storage device connected to receive the filtered count value established by the digital filter;

wherein the counter portion includes a first counter connected to receive the pulse width modulated signal and operable to count only when the pulse width modulated signal is in the predetermined state, and wherein the counter portion further includes a sampling counter having an output connected to a reset input of the first counter, a predetermined output of the sampling counter effective to reset the first counter, the sampling counter operable to provide the predetermined output to the first counter on a periodic basis.

2. The circuit, as set forth in claim 1, wherein the period between predetermined outputs provided by the sampling counter corresponds to the predetermined time period.

3. The circuit, as set forth in claim 1, wherein the storage device is connected to the output of the sampling counter for receiving the periodic predetermined outputs therefrom, the storage device operable in response to receipt of a given predetermined output to replace the stored count value therein with the filtered count value received from the digital filter.

4. The circuit, as set forth in claim 3, wherein the sampling counter includes a stall input connectable to receive an input signal, the sampling counter responsive to receipt of the input signal to modify the predetermined output provided to the storage device and the first counter.

5. The circuit, as set forth in claim 1, wherein the first counter is an up counter and the predetermined state is a high state of the pulse width modulated signal, the count value of the first counter being set to a digital zero in response to the predetermined output from the sampling counter.

6. The circuit, as set forth in claim 1, wherein the digital filter is a low pass filter including an adder and a subtracter.

7. The circuit, as set forth in claim 1, wherein the digital filter is connected to receive the count value established by the counter through a first multiplexer, and the digital filter is connected to receive the stored count value from the storage device through a second multiplexer.

8. A circuit for digitally monitoring a duty cycle of a plurality of pulse width modulated signals, comprising:

a plurality of counters, a first multiplexer, a second multiplexer, a digital filter, and a plurality of latches;

wherein each counter is connectable to receive a respective pulse width modulated signal and is operable to count only when the respective pulse width modulated signal is in a predetermined state;

the first multiplexer connected to receive the count values established by the counters;

the second multiplexer connected to receive stored count values from the latches;

the digital filter including an input connected to an output of the first multiplexer, and an input connected to an output of the second multiplexer; and the latches connected to an output of the digital filter.

9. The circuit, as set forth in claim 8, further comprising a sampling counter, the sampling counter including a plurality of sampling outputs, each sampling output connected to a respective selecting input of the first multiplexer, a respective selecting input of the second multiplexer, and to a respective one of the latches.

10. The circuit, as set forth in claim 9, wherein each counter includes a clock enable input for receiving its respective pulse width modulated signal and each sampling output of the sampler counter is connected to a reset input of a respective one of the counters.

11. The circuit, as set forth in claim 8, wherein each of the counters is an up counter.

12. A method of monitoring a duty cycle of a pulse width modulated signal, comprising the steps of:

performing a first counting operation during a predetermined state of the pulse width modulated signal to establish a count value;

filtering the count value established in the counting operation and a previously stored filtered count value so as to establish a filtered count value;

storing the filtered count value;

performing a second counting operation; and setting the count value to a perdetermined value when the second counting operation reaches a predetermined value.

13. method as set forth in claim 12 wherein the counting operation is performed for a predetermined time period.

14. The method, as set forth in claim 12 wherein filtering the count value comprises providing both the count value established in the counting operation and the previously stored count value as inputs to a digital filter.

15. The method as set forth in claim 12 wherein storing the filtered count value involves latching the filtered count value.

16. The method as set forth in claim 12 wherein the counting operation includes providing the pulse width modulated input signal as an input to a counter, the counter operable to count only when the pulse width modulated signal is in the predetermined state.

17. A method for monitoring a first signal having a first state and a second state, comprising:

receiving the first signal;

counting in a first predetermined manner when the first signal has one of the first and second states;

determining a current count value as a function of the counting in the first predetermined manner;

receiving a stored count value;

determining a filtered count value as a function of the current count value and the stored count value;

storing the filtered count value;

counting in a second predetermined manner; and setting the current count value to a predetermined value as a function of the counting in a second predetermined manner.

18. The method of claim 17 wherein the stored count value comprises a previous filtered count value.

19. The method of claim 17 wherein the setting the current count value to a predetermined value comprises setting the current count value to a predetermined value when the counting in the second predetermined manner reaches a predetermined count.

* * * * *